US012580292B2

(12) United States Patent
Arage et al.

(10) Patent No.: US 12,580,292 B2
(45) Date of Patent: Mar. 17, 2026

(54) EMBEDDED COPLANAR WAVEGUIDES FOR THIN-FILM MATERIAL CHARACTERIZATION AND METHODS RELATED TO THE SAME

(71) Applicants: GM Global Technology Operations LLC, Detroit, MI (US); The Ohio State University, Columbus, OH (US)

(72) Inventors: Alebel H. Arage, Lake Orion, MI (US); Kubilay Sertel, Hilliard, OH (US); Niru K. Nahar, Hilliard, OH (US); Yagmur Ozturk, Columbus, OH (US); Maruf Md. Sajjad Hossain, Columbus, OH (US)

(73) Assignees: GM Global Technology Operations LLC, Detroit, MI (US); The Ohio State University, Columbus, OH (US)

( * ) Notice: Subject to any disclaimer, the term of this patent is extended or adjusted under 35 U.S.C. 154(b) by 202 days.

(21) Appl. No.: 18/500,017

(22) Filed: Nov. 1, 2023

(65) Prior Publication Data

US 2025/0141078 A1      May 1, 2025

(51) Int. Cl.
H01P 3/00 (2006.01)
G01R 27/32 (2006.01)
H01P 3/06 (2006.01)

(52) U.S. Cl.
CPC .............. H01P 3/006 (2013.01); G01R 27/32 (2013.01); H01P 3/06 (2013.01)

(58) Field of Classification Search
CPC ............ H01P 3/006; H01P 3/06; G01R 27/32
See application file for complete search history.

(56) References Cited

U.S. PATENT DOCUMENTS

| | | | |
|---|---|---|---|
| 8,835,212 B2 * | 9/2014 | Avachat .............. | H01L 21/0256 |
| | | | 438/86 |
| 2003/0141942 A1 * | 7/2003 | McMorrow .......... | H05K 1/0239 |
| | | | 333/28 R |
| 2007/0040626 A1 * | 2/2007 | Blair ...................... | H05K 1/147 |
| | | | 333/1 |
| 2010/0066389 A1 * | 3/2010 | Subramanyam ..... | G01N 27/221 |
| | | | 156/64 |

(Continued)

FOREIGN PATENT DOCUMENTS

| | | | | |
|---|---|---|---|---|
| DE | 102017103083 B4 | 7/2023 | | |
| EP | 3079165 A1 * | 10/2016 | ......... | G01N 21/8422 |
| EP | 3079165 B1 | 7/2019 | | |

*Primary Examiner* — Akm Zakaria
(74) *Attorney, Agent, or Firm* — Honigman LLP; Matthew H. Szalach; Jonathan P. O'Brien

(57) ABSTRACT

A thin-film material measurement and characterization fixture system using an embedded coplanar waveguide fixture including a substrate layer, an upper conductor layer disposed on top of the substrate layer, the upper conductor layer including a first upper conductor layer and a second upper conductor layer spaced from the first upper conductor layer by a gap, a signal trace disposed on top of the substrate layer in the gap between the first upper conductor layer and the second upper conductor layer, and a superstrate layer disposed on top of the upper conductor layer and the signal trace, the superstrate layer filling the gap between the first upper conductor layer and the second upper conductor layer to achieve accurate thin-film characterization in the millimeter wave bands.

20 Claims, 5 Drawing Sheets

(56)     References Cited

U.S. PATENT DOCUMENTS

2015/0377946 A1 *  12/2015  Sinsheimer ...... G01R 31/31905
                                             324/762.01
2020/0174192 A1 *   6/2020  Hasan ................... G02B 6/136

* cited by examiner

EMBEDDED COPLANAR WAVEGUIDES FOR THIN-FILM MATERIAL CHARACTERIZATION AND METHODS RELATED TO THE SAME

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates generally to embedded coplanar waveguides for thin-film material characterization and methods related to the same.

Electrical characterization of thin dielectric materials with thicknesses less than a tenth of a wavelength may require complex and expensive setups for measurement (e.g., Terahertz. Spectroscopic (TS), Coplanar Waveguides (CPW), Rectangular Waveguides (RWG)). Additionally, paint- and thin-film characterization with these complex measurement systems are unreliable because they are thin and flexible. The electromagnetic wave does not propagate through enough material to experience significant and measurable interaction within the sample, and air gaps between traces and ground conductors of the CPW fixture may result in inaccurate material characterization due to measurement distortion. Accordingly, there is a desire to eliminate the formation of air gaps between the traces and ground conductors to reduce the measurement distortion associated with such configurations and improve accuracy of the paint- and thin-film Electromagnetic (EM)-characterization.

SUMMARY

One aspect of the disclosure provides an embedded coplanar waveguide (E-CPW) characterization system configured to characterize thin films, the characterization system including a lower conductor layer, a substrate layer disposed on top of the lower conductor layer, an upper conductor layer disposed on top of the substrate layer, the upper conductor layer including a first upper conductor layer and a second upper conductor layer spaced from the first upper conductor layer by a gap, a signal trace disposed on top of the substrate layer in the gap between the first upper conductor layer and the second upper conductor layer, a superstrate layer disposed on top of the upper conductor layer and the signal trace, the superstrate layer filling the gap between the first upper conductor layer and the second upper conductor layer, and a material under test disposed on top of the superstrate layer.

Implementations of the disclosure may include one or more of the following optional features. In some implementations, the system includes one or more connectors affixed to the signal trace. The one or more connectors may be configured to conduct radio frequency (RF) signals. The signal trace may be configured to conduct radio frequency (RF) signals.

The superstrate layer may be substantially flat to receive the material under test.

The substrate layer and the superstrate layer may be formed from the same material.

The superstrate layer may be configured to fill any gaps of air within the system.

Another aspect of the disclosure provides an embedded coplanar waveguide (E-CPW) characterization system configured to characterize thin films, the characterization system including a lower conductor layer, a substrate layer disposed on top of the lower conductor layer, an upper conductor layer disposed on top of the substrate layer, the upper conductor layer including a first upper conductor layer and a second upper conductor layer spaced from the first upper conductor layer by a gap, a signal trace disposed on top of the substrate layer in the gap between the first upper conductor layer and the second upper conductor layer, a superstrate layer disposed on top of the upper conductor layer and the signal trace, the superstrate layer filling the gap between the first upper conductor layer and the second upper conductor layer, and a material under test disposed on top of the superstrate layer.

Implementations of the disclosure may include one or more of the following optional features. In some implementations, the E-CPW system further includes one or more connectors connected to the signal trace. The one or more connectors may be configured to conduct radio frequency (RF) signals. The signal trace may be configured to conduct radio frequency (RF) signals.

The superstrate layer may be substantially flat to receive the material under test.

The substrate layer and the superstrate layer may be formed from the same material.

The superstrate layer may be configured to fill any gaps of air within the system.

Another aspect of the disclosure provides a system including a substrate layer, an upper conductor layer disposed on top of the substrate layer, the upper conductor layer including a first upper conductor layer and a second upper conductor layer spaced from the first upper conductor layer by a gap, a signal trace disposed on top of the substrate layer in the gap between the first upper conductor layer and the second upper conductor layer, and a superstrate layer disposed on top of the upper conductor layer and the signal trace, the superstrate layer filling the gap between the first upper conductor layer and the second upper conductor layer.

Implementations of the disclosure may include one or more of the following optional features. In some implementations, the system includes one or more connectors connected to the signal trace. The one or more connectors may be configured to conduct radio frequency (RF) signals. The signal trace may be configured to conduct radio frequency (RF) signals.

The system may further include a lower conductor layer disposed underneath the substrate layer.

The system may further include a material under test disposed on top of the superstrate layer.

The details of one or more implementations of the disclosure are set forth in the accompanying drawings and description below. Other aspects, features, and advantages will be apparent from the description, drawings, and claims.

BRIEF DESCRIPTION OF THE DRAWINGS

The drawings described herein are for illustrative purposes only of selected configurations and are not intended to limit the scope of the present disclosure.

Corresponding reference numerals indicate corresponding parts throughout the drawings.

DETAILED DESCRIPTION

Figure 1:
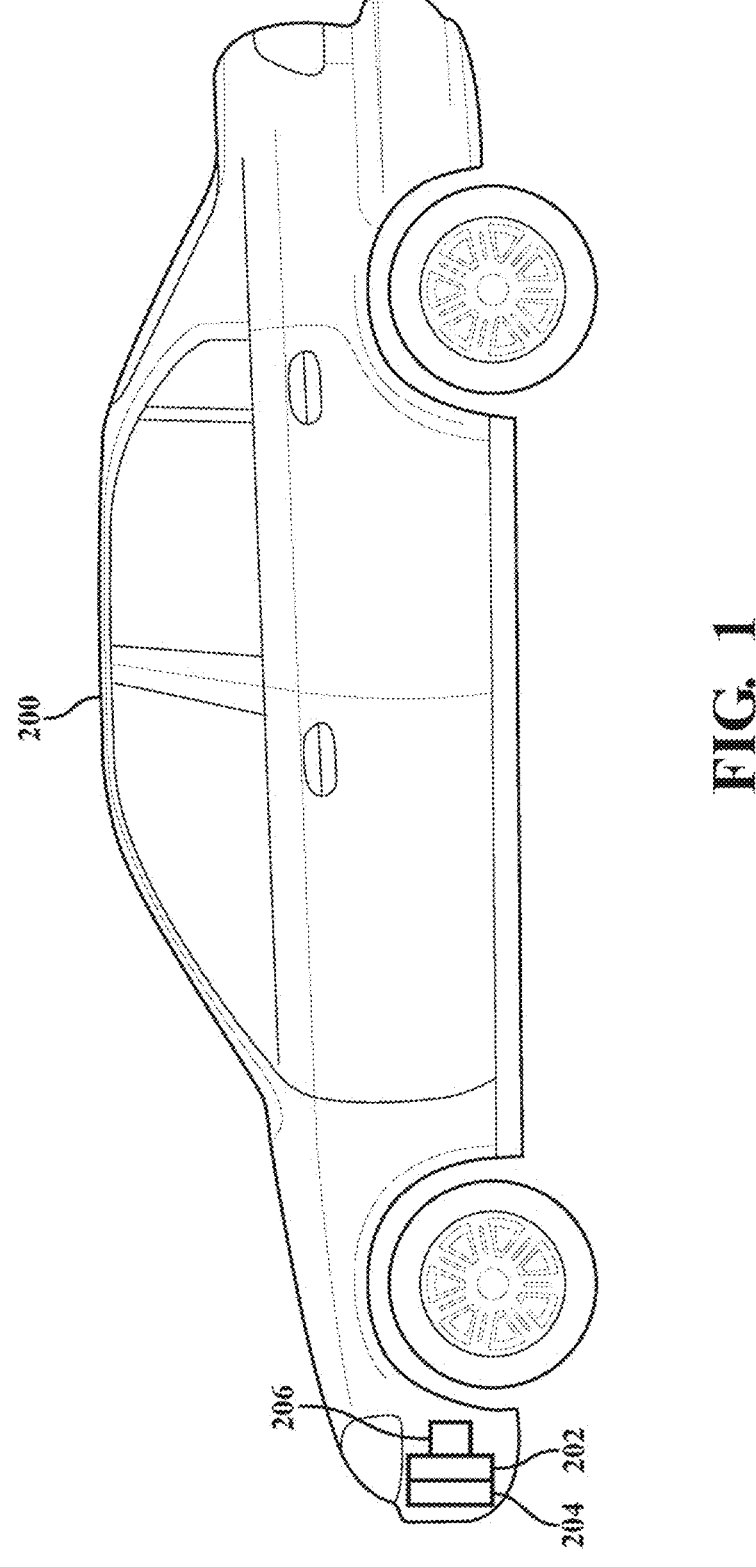
FIG. 1 is a schematic illustration of a vehicle including a radio frequency (RF) device, such as a millimeter-wave radar.

Example configurations will now be described more fully with reference to the accompanying drawings. Example configurations are provided so that this disclosure will be thorough, and will fully convey the scope of the disclosure to those of ordinary skill in the art. Specific details are set forth such as examples of specific components, devices, and methods, to provide a thorough understanding of configurations of the present disclosure. It will be apparent to those of ordinary skill in the art that specific details need not be employed, that example configurations may be embodied in many different forms, and that the specific details and the example configurations should not be construed to limit the scope of the disclosure.

The terminology used herein is for the purpose of describing particular exemplary configurations only and is not intended to be limiting. As used herein, the singular articles "a," "an," and "the" may be intended to include the plural forms as well, unless the context clearly indicates otherwise. The terms "comprises," "comprising," "including," and "having," are inclusive and therefore specify the presence of features, steps, operations, elements, and/or components, but do not preclude the presence or addition of one or more other features, steps, operations, elements, components, and/or groups thereof. The method steps, processes, and operations described herein are not to be construed as necessarily requiring their performance in the particular order discussed or illustrated, unless specifically identified as an order of performance. Additional or alternative steps may be employed.

When an element or layer is referred to as being "on," "engaged to," "connected to," "attached to," or "coupled to" another element or layer, it may be directly on, engaged, connected, attached, or coupled to the other element or layer, or intervening elements or layers may be present. In contrast, when an element is referred to as being "directly on," "directly engaged to," "directly connected to," "directly attached to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The terms "first," "second," "third," etc. may be used herein to describe various elements, components, regions, layers and/or sections. These elements, components, regions, layers and/or sections should not be limited by these terms. These terms may be only used to distinguish one element, component, region, layer or section from another region, layer or section. Terms such as "first," "second," and other numerical terms do not imply a sequence or order unless clearly indicated by the context. Thus, a first element, component, region, layer or section discussed below could be termed a second element, component, region, layer or section without departing from the teachings of the example configurations.

In this application, including the definitions below, the term "module" may be replaced with the term "circuit." The term "module" may refer to, be part of, or include an Application Specific Integrated Circuit (ASIC); a digital, analog, or mixed analog/digital discrete circuit; a digital, analog, or mixed analog/digital integrated circuit: a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term "code," as used above, may include software, firmware, and/or microcode, and may refer to programs, routines, functions, classes, and/or objects. The term "shared processor" encompasses a single processor that executes some or all code from multiple modules. The term "group processor" encompasses a processor that, in combination with additional processors, executes some or all code from one or more modules. The term "shared memory" encompasses a single memory that stores some or all code from multiple modules. The term "group memory" encompasses a memory that, in combination with additional memories, stores some or all code from one or more modules. The term "memory" may be a subset of the term "computer-readable medium." The term "computer-readable medium" does not encompass transitory electrical and electromagnetic signals propagating through a medium, and may therefore be considered tangible and non-transitory memory. Non-limiting examples of a non-transitory memory include a tangible computer readable medium including a nonvolatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

A software application (i.e., a software resource) may refer to computer software that causes a computing device to perform a task. In some examples, a software application may be referred to as an "application," an "app," or a "program." Example applications include, but are not limited to, system diagnostic applications, system management applications, system maintenance applications, word processing applications, spreadsheet applications, messaging applications, media streaming applications, social networking applications, and gaming applications.

The non-transitory memory may be physical devices used to store programs (e.g., sequences of instructions) or data (e.g., program state information) on a temporary or permanent basis for use by a computing device. The non-transitory memory may be volatile and/or non-volatile addressable semiconductor memory. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

Various implementations of the systems and techniques described herein can be realized in digital electronic and/or optical circuitry, integrated circuitry, specially designed ASICS (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

The processes and logic flows described in this specification can be performed by one or more programmable processors, also referred to as data processing hardware, executing one or more computer programs to perform functions by operating on input data and generating output. The processes and logic flows can also be performed by special purpose logic circuitry. e.g., an FPGA (field programmable gate array) or an ASIC (application specific integrated circuit). Processors suitable for the execution of a computer program include, by way of example, both general and special purpose microprocessors, and any one or more processors of any kind of digital computer. Generally, a processor will receive instructions and data from a read only memory or a random-access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices: magnetic disks, e.g., internal hard disks or removable disks: magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well: for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user: for example, by sending web pages to a web browser on a user's client device in response to requests received from the web browser.

Figure 2:
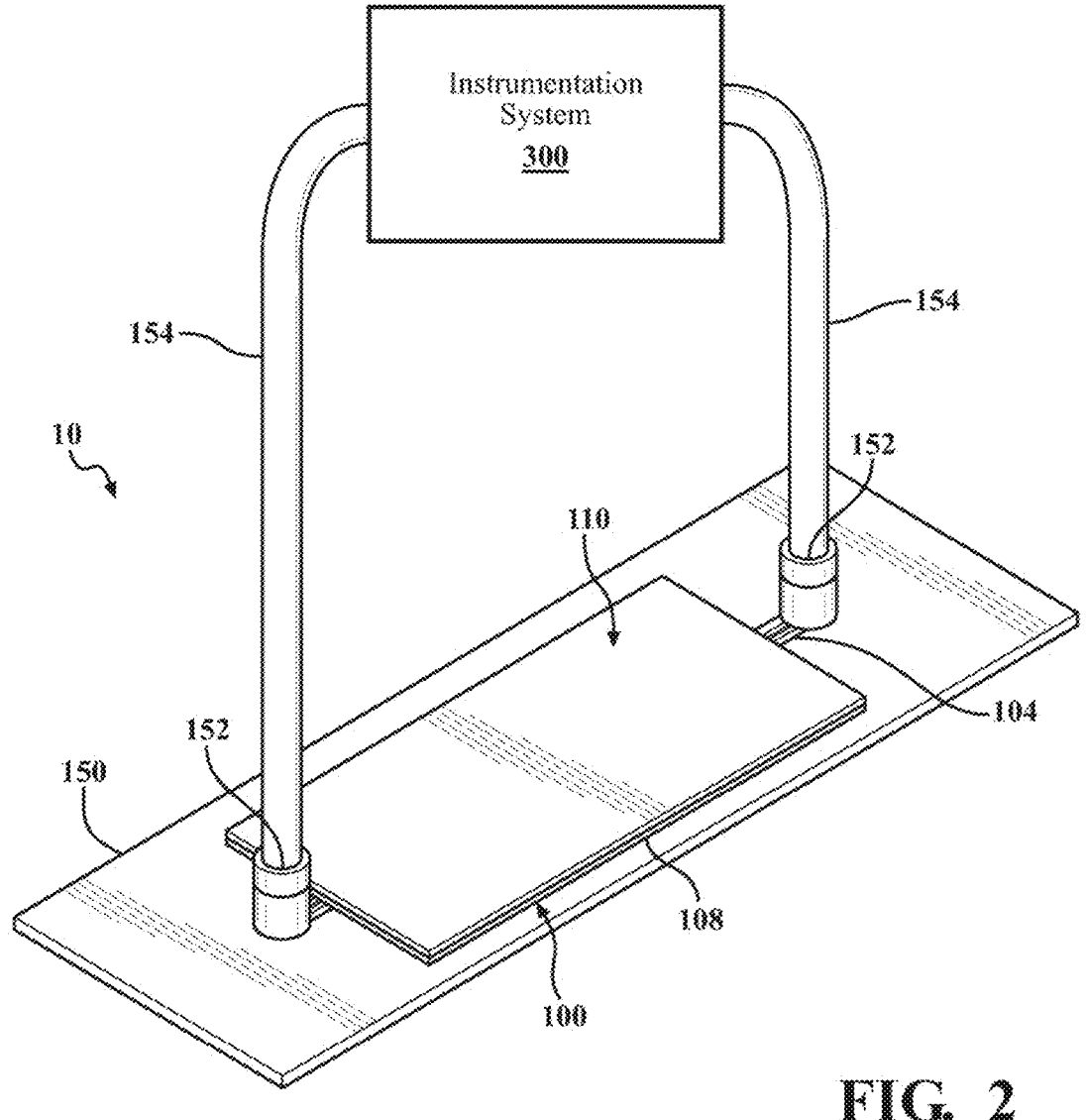
FIG. 2 is a perspective view of an embedded coplanar waveguide (E-CPW) characterization or measurement system of the present disclosure for use with the RF device of FIG. 1.

Referring to FIG. 2, an embedded coplanar waveguide (E-CPW) characterization or measurement system 10 is generally shown. In certain configurations, a vehicle system 200 may include a bumper or a fascia 202, as shown in FIG. 1. The E-CPW characterization or measurement system 10 may be used to characterize or measure paint and/or thin-films embedded within the bumper or fascia 202 that houses one or more radio frequency (RF) devices 204. The one or more radio frequency (RF) devices 204 may include millimeter wave radar sensors that emit Radio Frequency (RF) waves propagating through the painted fascia or bumper 202, or through any other suitable layer, such as a windshield, window, etc. The E-CPW characterization system 10 may be used to perform compatibility analyses to measure and characterize paint- and thin-film samples within a broad millimeter wave frequency band (e.g., from 60 to 140 GHZ). The paint- and thin-film compatibility analyses may be performed in any suitable location, such as a vehicle plant, a vehicle dealership workshop, a paint manufacturing plant, thin-film polymer paint manufacturing plant, a packaging material (e.g., fascia, grill, bumper, etc.) manufacturing plant, an RF-equipment manufacturing plant, an RF-equipment maintenance shop, an RF-equipment installation plant, etc.

Figure 3A:
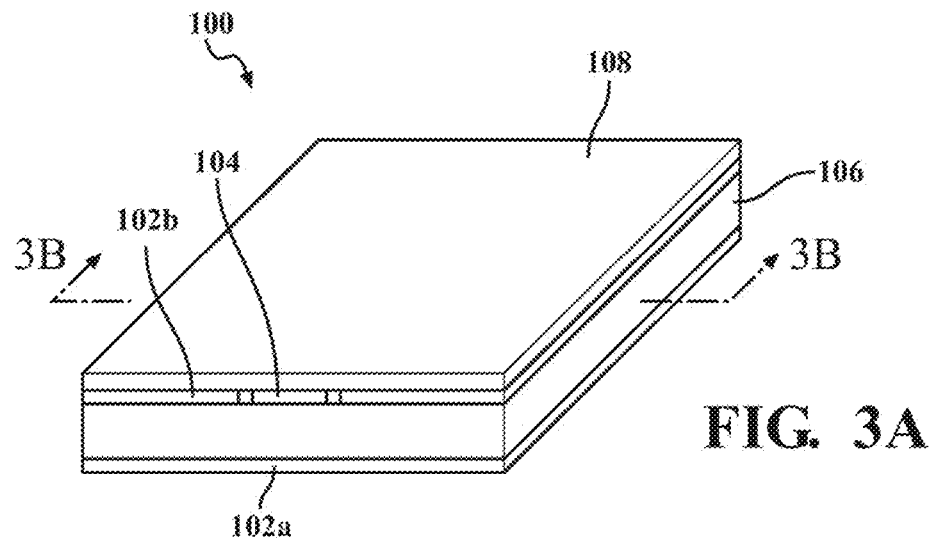
FIG. 3A is a perspective view of an E-CPW assembly of the E-CPW characterization or measurement system of FIG. 2.
Figure 3B:
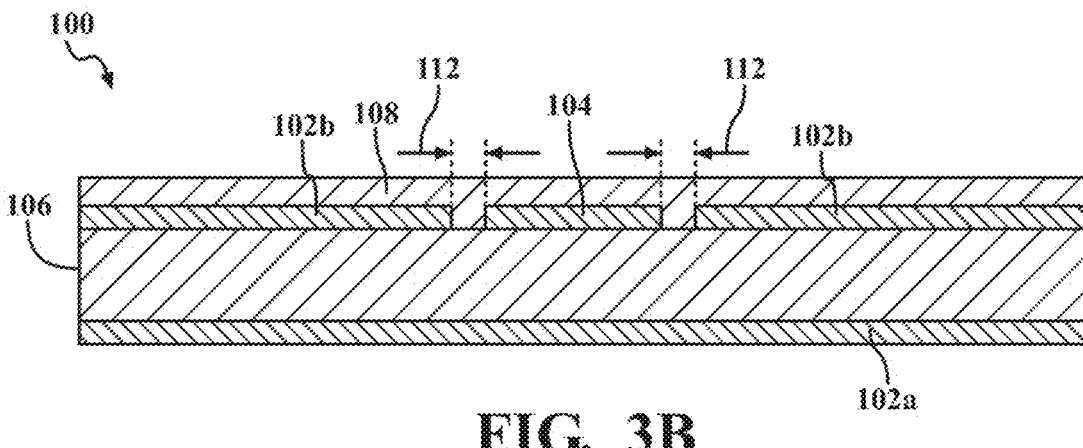
FIG. 3B is a cross-sectional view of the E-CPW assembly of FIG. 2, taken along line 3B-3B of FIG. 3A.
Figure 3C:
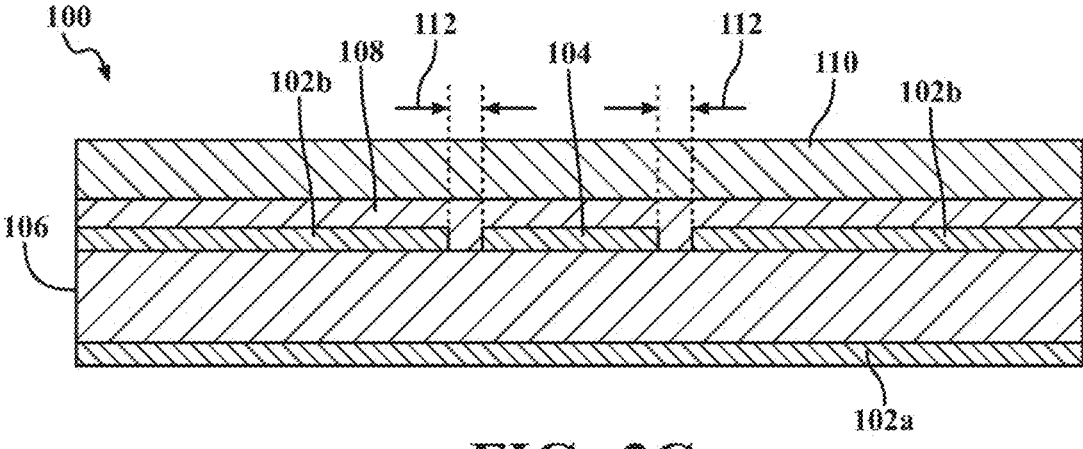
FIG. 3C is a cross-sectional view of the E-CPW assembly of FIG. 2 including a layer of paint, taken along line 3B-3B of FIG. 3A.
Figure 4:
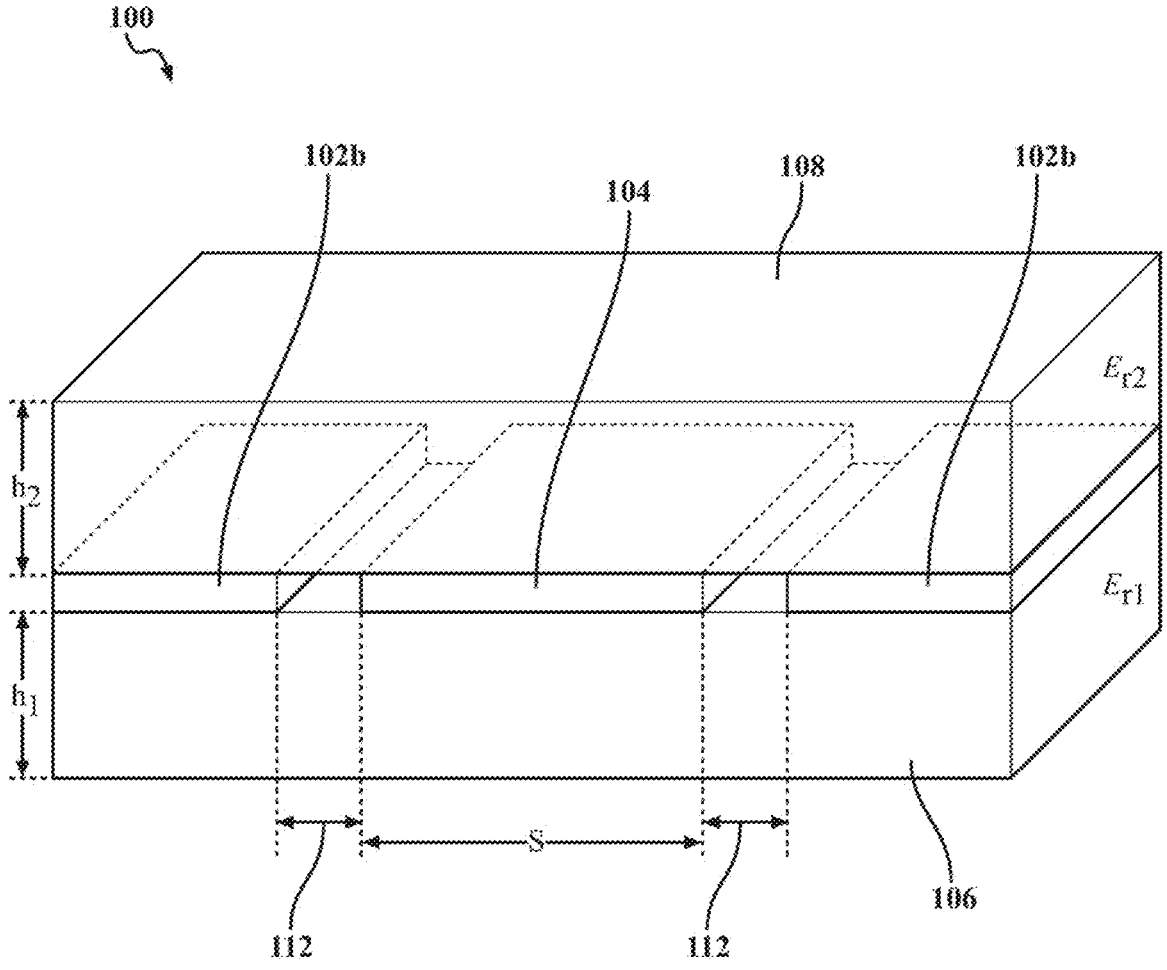
FIG. 4 is a schematic perspective view of the E-CPW assembly of FIG. 2.

The E-CPW characterization system 10 may include an E-CPW assembly 100 including several components, as shown in FIGS. 2-4. The E-CPW assembly 100 may be incorporated on a printed circuit board (PCB) 150, which may include two connectors 152 connected to a signal trace 104 of the E-CPW assembly 100. In some implementations, the connectors 152 may connect the E-CPW assembly 100 to an instrumentation system 300 (e.g., Vector Network Analyzer or an equivalent RF transmit-receive system) through a 1 mm broad-band coax cable 154 (e.g., DC-100 GHZ).

Referring to FIGS. 3A-4, the E-CPW assembly 100 includes a lower conductor layer 102a and a substrate layer 106 disposed on top of the lower conductor layer 102a. The E-CPW assembly 100 includes an upper conductor layer 102b disposed on top of the substrate layer 106. The conductor layers 102a, 102b may be formed of any suitable material for grounding electricity, e.g., steel, copper, cladding steel, etc. The upper conductor layer 102b includes two portions that are spaced apart from each other by air gaps 112 and a signal trace 104 disposed on top of the substrate layer 106.

The signal trace 104 is configured to conduct radio frequency (RF) signals. The E-CPW assembly 100 may be implemented to operate in any frequency band including in micro- and millimeter-wave frequency bands.

The E-CPW assembly 100 includes a superstrate layer 108 disposed on top of the upper conductor layer 102b and the signal trace 104. The superstrate layer 108 extends into the air gap 112 between the signal trace 104 and two portions of the upper conductor layer 102b and contacts the substrate layer 106. The superstrate layer 108 may be formed from any suitable RF-substrate material, including, but not limited to Rogers, quartz, acrylic, etc. In some implementations, the substrate layer 106 and the superstrate layer 108 are formed from the same material. In other implementations, the substrate layer 106 and the superstrate layer 108 are formed from different materials.

The superstrate layer 108 includes a flat top surface for repeatable and firm-flat placement of paint and thin-film samples. The superstrate layer 108 may enable an accurate paint- and thin-film dielectric characterization (e.g., permittivity and loss tangent estimation) by eliminating the formation of airgaps between the signal trace 104 and the upper conductor layer 102b and top surface of the substrate layer 106, particularly when realizing a printed circuit board (PCB)-based fixture for a less complex and less expensive broad-band measurement technique (e.g., from 60 to 140 GHz).

Referring to FIG. 3C, the E-CPW assembly 100 includes a paint layer 110 disposed on top of the substrate layer 108. The paint layer 110 may be configured to match the color of the bumper or fascia 202.

A material under test (MUT), e.g., the paint layer 110, may be analyzed to determine the actual permittivity of the MUT by applying Nicholson-Ross Weir (NRW) based analytical permittivity extraction formulas using measured S-parameters of the paint- or thin-film loaded E-CPW measurement apparatus 10. The relevant formulas that are based on conventional quasi-static field approximations are given as:

$$\epsilon_{eff_2} = 1 + q_1(\epsilon_{r1} - 1) + q_2(\epsilon_{r2} - 1) \tag{1}$$

$$q_{1,2} = \frac{1}{2} \frac{K(m_{1,2})}{K(m'_{1,2})} \frac{K(m'_0)}{K(m_0)} \tag{2}$$

$$m_{1,2} = \frac{\sinh\left(\frac{\pi S}{4h_{1,2}}\right)}{\sinh\left(\frac{\pi(S + 2W)}{4h_{1,2}}\right)} \tag{3}$$

$$m'_{1,2} = \sqrt{1 - m_{1,2}^2} \tag{4}$$

$$m_0 = \frac{S}{S + 2W} \tag{5}$$

$$m'_0 = \sqrt{1 - m_0^2} \tag{6}$$

The above formulas are approximate for thick Copper traces as well as air gaps between traces, as mentioned above.

To eliminate the air gaps, the superstrate layer 108 is introduced to fill the gap 112 between the signal trace 104 and the upper conductor layer 102b and top surface of the substrate layer 106, thus ensuring a flat placement of the paint layer 110 on the fixture with no airgaps.

Figure 5A:
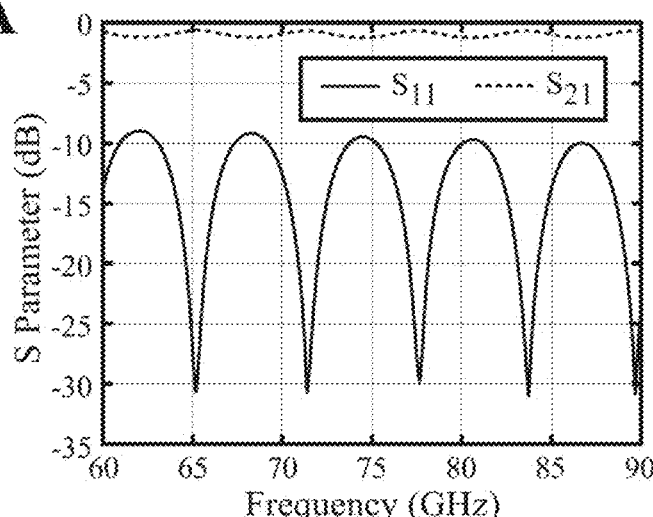
FIG. 5A is a graphical illustration showing calibrated S-parameters from simulation/measurement.
Figure 5B:
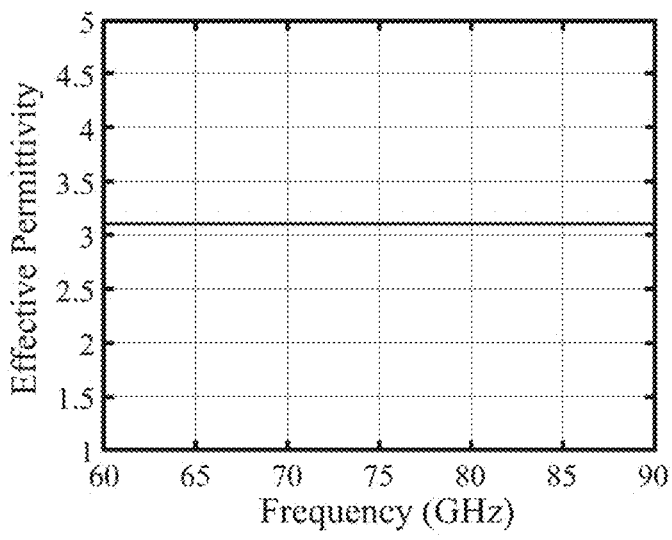
FIG. 5B is a graphical illustration showing the calibrated S-parameters from simulation/measurement after the application of Nicholson-Ross-Weir (NRW) based analytical formulas.
Figure 5C:
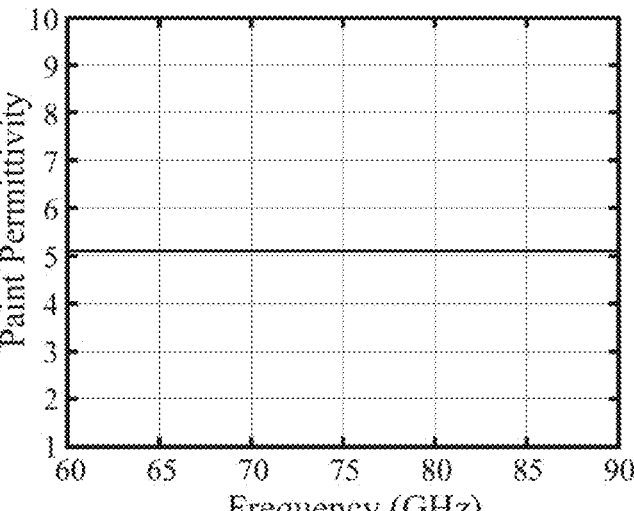
FIG. 5C is a graphical illustration showing multi-dimensional functional fit applied to the NRW-adjusted S-parameters.

Referring to FIGS. 4-5C, the permittivity extraction process is based on calibrated measurement of S-parameters of the paint- or thin-film loaded fixture. Measured S-parameters are first used to determine the effective permittivity of the signal trace 104 with no MUT from the wave propagation characteristics on the signal trace 104. Effective permittivity of the signal trace 104 with no MUT may then be used, after calibration, to determine the material permittivity of the substrate layer 106 and geometry of the embedded E-CPW assembly 100. This information is used in processing the paint-loaded embedded E-CPW assembly 100 measurement. Adding a thin paint layer 110 changes the effective permittivity and enables the extraction of paint permittivity and loss tangent of the material sample on top of the E-CPW assembly 100. The change in permittivity may depend on the material properties and its thickness in a complex functional form, and a multi-dimensional polynomial/surface fit using simulated paints with different thicknesses d (i.e., from 30 to 210 um) and permittivities $\epsilon p$ (i.e., 3 to 15) is used to determine the sample permittivity and loss tangent using effective permittivity of the empty and sample loaded test fixtures which are calculated via the NRW process. A multi-dimensional functional fit can be:

$$\epsilon_{eff}(d, \epsilon_p) = p_{00} + p_{10}d + p_{10}\epsilon_p + p_{20}d^2 + \tag{7}$$

$$p_{11}d \times \epsilon_p + p_{02}\epsilon_p^2 + p_{30}d^3 + p_{21}d^2 \times \epsilon_p + p_{12}d \times \epsilon_p^2 + p_{03}\epsilon_p^3$$

Referring to FIG. 5A, calibrated S parameters (dB) are shown as a function of frequency (GHz) from simulation and/or measurement of an exemplary MUT. Referring to FIG. 5B, the above-mentioned NRW procedure is applied to the calibrated S-parameters to calculate the effective permittivity of the MUT with respect to frequency (GHz). Referring to FIG. 5C, surface fit operations are applied to the NRW-adjusted calibrated S-parameters to show paint permittivity relative to frequency (GHz).

A number of implementations have been described. Nevertheless, it will be understood that various modifications may be made without departing from the spirit and scope of the disclosure. Accordingly, other implementations are within the scope of the following claims.

The foregoing description has been provided for purposes of illustration and description. It is not intended to be exhaustive or to limit the disclosure. Individual elements or features of a particular configuration are generally not limited to that particular configuration, but, where applicable, are interchangeable and can be used in a selected configuration, even if not specifically shown or described. The same may also be varied in many ways. Such variations are not to be regarded as a departure from the disclosure, and all such modifications are intended to be included within the scope of the disclosure.

What is claimed is:

1. A measurement fixture comprising:
   a lower conductor layer;
   a substrate layer disposed on top of the lower conductor layer;
   an upper conductor layer disposed on top of the substrate layer, the upper conductor layer including a first upper conductor layer and a second upper conductor layer spaced from the first upper conductor layer by a gap;

a signal trace disposed on top of the substrate layer in the gap between the first upper conductor layer and the second upper conductor layer;

a superstrate layer disposed on top of the upper conductor layer and the signal trace, the superstrate layer being formed from a radio frequency-compatible dielectric material and does not contribute to charge storage or capacitive behavior, and the superstrate layer filling the gap between the first upper conductor layer and the second upper conductor layer; and a material under test disposed on top of the superstrate layer;

wherein the first upper conductor layer, the second upper conductor layer, the gap therebetween, the signal trace, and the superstrate layer are all coplanar with one another.

2. The measurement fixture of claim 1, further comprising one or more connectors affixed to the signal trace.

3. The measurement fixture of claim 2, wherein the one or more connectors are configured to conduct radio frequency (RF) signals.

4. The measurement fixture of claim 2, wherein the signal trace is configured to conduct radio frequency (RF) signals.

5. The measurement fixture of claim 1, wherein the superstrate layer is substantially flat to receive the material under test.

6. The measurement fixture of claim 1, wherein the substrate layer and the superstrate layer are formed from the same material.

7. The measurement fixture of claim 1, wherein the superstrate layer is configured to fill any gaps of air within the system.

8. An embedded coplanar waveguide (E-CPW) characterization system configured to characterize thin films, the E-CPW characterization system comprising:

a lower conductor layer;

a substrate layer disposed on top of the lower conductor layer;

an upper conductor layer disposed on top of the substrate layer, the upper conductor layer including a first upper conductor layer and a second upper conductor layer spaced from the first upper conductor layer by a gap;

a signal trace disposed on top of the substrate layer in the gap between the first upper conductor layer and the second upper conductor layer;

a superstrate layer disposed on top of the upper conductor layer and the signal trace, the superstrate layer being formed from a radio frequency-compatible dielectric material and does not contribute to charge storage or capacitive behavior, and the superstrate layer filling the gap between the first upper conductor layer and the second upper conductor layer; and a material under test disposed on top of the superstrate layer;

wherein the first upper conductor layer, the second upper conductor layer, the gap therebetween, the signal trace, and the superstrate layer are all coplanar with one another.

9. The E-CPW characterization system of claim 8, further comprising one or more connectors connected to the signal trace.

10. The E-CPW characterization system of claim 9, wherein the one or more connectors are configured to conduct radio frequency (RF) signals.

11. The E-CPW characterization system of claim 9, wherein the signal trace is configured to conduct radio frequency (RF) signals.

12. The E-CPW characterization system of claim 8, wherein the superstrate layer is substantially flat to receive the material under test.

13. The E-CPW characterization system of claim 8, wherein the substrate layer and the superstrate layer are formed from the same material.

14. The E-CPW characterization system of claim 8, wherein the superstrate layer is configured to fill any gaps of air within the system.

15. A fixture comprising:

a substrate layer;

an upper conductor layer disposed on top of the substrate layer, the upper conductor layer including a first upper conductor layer and a second upper conductor layer spaced from the first upper conductor layer by a gap;

a signal trace disposed on top of the substrate layer in the gap between the first upper conductor layer and the second upper conductor layer; and a superstrate layer disposed on top of the upper conductor layer and the signal trace, the superstrate layer being formed from a radio frequency-compatible dielectric material and does not contribute to charge storage or capacitive behavior, and the superstrate layer filling the gap between the first upper conductor layer and the second upper conductor layer;

wherein the first upper conductor layer, the second upper conductor layer, the gap therebetween, the signal trace, and the superstrate layer are all coplanar with one another.

16. The fixture of claim 15, further comprising one or more connectors connected to the signal trace.

17. The fixture of claim 16, wherein the one or more connectors are configured to conduct radio frequency (RF) signals.

18. The fixture of claim 16, wherein the signal trace is configured to conduct radio frequency (RF) signals.

19. The fixture of claim 15, further comprising a lower conductor layer disposed underneath the substrate layer.

20. The fixture of claim 15, further comprising a material under test disposed on top of the superstrate layer.

* * * * *